US012617981B2

(12) United States Patent
Akiyama et al.

(10) Patent No.: US 12,617,981 B2
(45) Date of Patent: May 5, 2026

(54) PRESSURE-SENSITIVE ADHESIVE SHEET FOR SEMICONDUCTOR PROCESSING

(71) Applicant: NITTO DENKO CORPORATION, Ibaraki (JP)

(72) Inventors: Jun Akiyama, Ibaraki (JP); Yuji Kato, Ibaraki (JP); Taiki Ueno, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 344 days.

(21) Appl. No.: 18/358,791

(22) Filed: Jul. 25, 2023

(65) Prior Publication Data

US 2024/0034914 A1 Feb. 1, 2024

(30) Foreign Application Priority Data

Jul. 26, 2022 (JP) ................................. 2022-119112

(51) Int. Cl.
| | |
|---|---|
| *C09J 7/38* | (2018.01) |
| *C08F 220/18* | (2006.01) |
| *C08K 5/524* | (2006.01) |
| *C09J 11/06* | (2006.01) |
| *C09J 133/06* | (2006.01) |
| *H10P 72/70* | (2026.01) |

(52) U.S. Cl.
CPC ......... *C09J 7/385* (2018.01); *C08F 220/1808* (2020.02); *C08F 220/1812* (2020.02); *C09J 11/06* (2013.01); *C09J 133/066* (2013.01); *H10P 72/7402* (2026.01); *C08F 2500/22* (2013.01); *C08F 2500/26* (2013.01); *C08F 2800/10* (2013.01); *C08K 5/524* (2013.01); *C09J 2203/326* (2013.01); *C09J 2301/302* (2020.08); *C09J 2301/312* (2020.08); *C09J 2301/408* (2020.08); *C09J 2423/006* (2013.01); *C09J 2467/006* (2013.01)

(58) Field of Classification Search
CPC .......... C08F 220/1808; C08F 220/1812; C08F 2500/22; C08F 2500/26; C08F 2800/10; C08K 5/524; C09J 11/06; C09J 133/066; C09J 2203/326; C09J 2301/302; C09J 2301/312; C09J 2301/408; C09J 2423/006; C09J 2467/0006; C09J 7/385; C09J 7/241; C09J 7/255; C09J 2433/00; C09J 2467/006; C09J 133/10; C09J 133/14; C09J 133/24; C09J 2423/046; H10P 72/7402; H10P 72/7416; H01L 21/6836; H01L 2221/68327
See application file for complete search history.

(56) References Cited

U.S. PATENT DOCUMENTS

| | | | | |
|---|---|---|---|---|
| 2008/0118764 A1* | 5/2008 | Shintani | ............. | H01L 21/6836 |
| | | | | 428/500 |
| 2011/0053346 A1* | 3/2011 | Matsumura | ....... | H01L 21/67132 |
| | | | | 428/423.1 |

FOREIGN PATENT DOCUMENTS

| | | | |
|---|---|---|---|
| JP | 5607847 | B1 | 10/2014 |
| WO | 2018083987 | A1 | 5/2018 |

* cited by examiner

*Primary Examiner* — John D Freeman
(74) *Attorney, Agent, or Firm* — Alleman Hall LLP

(57) ABSTRACT

Provided is a pressure-sensitive adhesive sheet for semiconductor processing having excellent solvent resistance. The pressure-sensitive adhesive sheet for semiconductor processing includes a pressure-sensitive adhesive layer formed of a pressure-sensitive adhesive composition containing a base polymer, and a base material. The pressure-sensitive adhesive composition has a swelling degree $S_A$ of 2.1 times or less when immersed in an N,N-dimethylpropionamide solution at 23° C. for 1 hour.

7 Claims, 1 Drawing Sheet

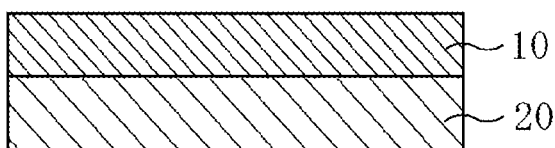

PRESSURE-SENSITIVE ADHESIVE SHEET FOR SEMICONDUCTOR PROCESSING

CROSS REFERENCE TO RELATED APPLICATIONS

This application claims priority under 35 U.S.C. Section 119 to Japanese Patent Application No. 2022-119112 filed on Jul. 26, 2022, which is herein incorporated by reference.

BACKGROUND OF THE INVENTION

1. Field of the Invention

The present disclosure relates to a pressure-sensitive adhesive sheet for semiconductor processing.

2. Description of the Related Art

A semiconductor wafer is used for various usages, such as a personal computer, a smartphone, and an automobile. In a processing process for the semiconductor wafer, a pressure-sensitive adhesive tape is used for protecting a surface thereof at the time of processing. In recent years, miniaturization and high functionalization of a large-scale integration (LSI) have been proceeding, and integration of integrated circuits (IC) has been performed not only in a two-dimensional manner but also in a three-dimensional manner. In any of those technologies, a wafer is thinly ground. The thinly ground wafer is brittle, and hence temporary bonding of the wafer is performed using an adhesive for protection of the wafer at the time of conveyance. The adhesive to be used for the temporary bonding is no longer needed after the conveyance to the next step, and hence is removed by, for example, solvent washing. However, performance of the pressure-sensitive adhesive tape used for protection of a semiconductor is reduced owing to the removal step with a solvent, and hence the wafer may not be sufficiently protected. In each of WO2018/083987A1 and Japanese Patent No. 5607847, there is a disclosure of a pressure-sensitive adhesive tape for semiconductor processing having excellent solvent resistance. However, a wafer ground to a thinner shape (e.g., about 50 μm) may not be sufficiently protected with such pressure-sensitive adhesive tape.

SUMMARY OF THE INVENTION

The present disclosure has been made to solve the above-mentioned problems of the related art, and an object of the present disclosure is to provide a pressure-sensitive adhesive sheet for semiconductor processing having excellent solvent resistance.

1. In a first aspect according to at least one embodiment of the present disclosure, there is provided a pressure-sensitive adhesive sheet for semiconductor processing, including a pressure-sensitive adhesive layer formed of a pressure-sensitive adhesive composition containing a base polymer, and a base material. The pressure-sensitive adhesive composition has a swelling degree $S_A$ of 2.1 times or less when immersed in an N,N-dimethylpropionamide solution at 23° C. for 1 hour.

2. In the pressure-sensitive adhesive sheet for semiconductor processing according to the above-mentioned first aspect, a content ratio of an ester of one of acrylic acid or methacrylic acid having an alkyl group having 8 or more carbon atoms in all monomer components for forming the base polymer may be 50 wt % or more.

3. In the pressure-sensitive adhesive sheet for semiconductor processing according to the above-mentioned first or second aspect, the base polymer may be a polymer having a carbon-carbon double bond introduced thereinto.

4. In the pressure-sensitive adhesive sheet for semiconductor processing according to any one of the above-mentioned first to third aspects, the base material may contain one of a polyester-based resin or a polyolefin-based resin.

5. In the pressure-sensitive adhesive sheet for semiconductor processing according to any one of the above-mentioned first to fourth aspects, the pressure-sensitive adhesive composition may further contain a phosphoric acid ester-based surfactant.

6. In the pressure-sensitive adhesive sheet for semiconductor processing according to the above-mentioned fifth aspect, a content of the phosphoric acid ester-based surfactant may be 0.03 part by weight or more with respect to 100 parts by weight of the base polymer.

7. The pressure-sensitive adhesive sheet for semiconductor processing according to any one of the above-mentioned first to sixth aspects may be used in a semiconductor processing process including a solvent washing step.

BRIEF DESCRIPTION OF THE DRAWING

The FIGURE is a schematic sectional view of a pressure-sensitive adhesive sheet for semiconductor processing according to at least one embodiment of the present disclosure.

DESCRIPTION OF THE EMBODIMENTS

A. Overall Configuration of Pressure-Sensitive Adhesive Sheet for Semiconductor Processing The FIGURE is a schematic sectional view of a pressure-sensitive adhesive sheet for semiconductor processing according to at least one embodiment of the present disclosure. In the illustrated example, a pressure-sensitive adhesive sheet 100 for semiconductor processing includes a base material 10 and a pressure-sensitive adhesive layer 20 arranged on one surface of the base material. The pressure-sensitive adhesive sheet for semiconductor processing may include any appropriate other layer (not shown). For example, any appropriate layer (e.g., an intermediate layer) may be formed between the base material and the pressure-sensitive adhesive layer. The base material 10 is a single layer in the illustrated example, but may be a laminate of two or more layers. In the pressure-sensitive adhesive sheet for semiconductor processing, a release liner may be arranged outside the pressure-sensitive adhesive layer for the purpose of protecting the pressure-sensitive adhesive layer until the sheet is subjected to use.

The pressure-sensitive adhesive layer 20 is formed of a pressure-sensitive adhesive composition containing a base polymer. The pressure-sensitive adhesive composition has a swelling degree $S_A$ of 2.1 times or less when immersed in an N,N-dimethylpropionamide solution at 23° C. for 1 hour. When the swelling degree $S_A$ is 2.1 times or less, the pressure-sensitive adhesive sheet for semiconductor processing having excellent solvent resistance can be provided. The swelling degree S A is preferably 2.0 times or less, more preferably 1.9 times or less, still more preferably 1.8 times or less. The swelling degree $S_A$ is preferably as close as possible to 1 time. As used herein, the "swelling degree $S_A$" means a swelling degree measured by the following method: 0.1 part by weight of a pressure-sensitive adhesive sample is covered with a porous polytetrafluoroethylene film having an average pore diameter of 0.2 μm in a drawstring bag shape, and then an opening is tied with a kite string. Thus, an evaluation sample is obtained. As the porous polytetrafluoroethylene film, for example, a product available under the product name "Nitoflon (trademark) NTF1122" (manufactured by Nitto Denko Corporation, average pore diameter: 0.2 μm, porosity: 75%, thickness: 85 μm) may be used. The evaluation sample is immersed in 50 mL of an N,N-dimethylpropionamide solution at 23° C. for 1 hour. Then, the evaluation sample is taken out from the N,N-dimethylpropionamide solution. Next, the N,N-dimethylpropionamide solution adhering to the outer surface of the evaluation sample is wiped off, and the weight of the evaluation sample is measured. The swelling degree $S_A$ is calculated from the following formula based on the measured weight:

$$\text{Swelling degree } S_A \text{ (times)}=(W4-W2-W3)/(W1)$$

where W1 represents the weight of 0.1 part by weight of the pressure-sensitive adhesive composition, W2 represents the weight of the porous polytetrafluoroethylene film used for covering the pressure-sensitive adhesive composition, W3 represents the weight of the kite string, and W4 represents the weight of the evaluation sample after the immersion.

The thickness of the pressure-sensitive adhesive sheet for semiconductor processing according to at least one embodiment of the present disclosure may be set to any appropriate thickness. The thickness of the pressure-sensitive adhesive sheet for semiconductor processing is, for example, preferably from 20 μm to 1,000 μm, more preferably from 50 μm to 300 μm, still more preferably from 100 μm to 300 μm.

B. Base Material

The base material 10 may be formed of any appropriate resin. Specific examples of the resin for forming the base material include polyester-based resins, such as polyethylene terephthalate (PET), polyethylene naphthalate (PEN), polybutylene terephthalate (PBT), and polybutylene naphthalate (PBN), an ethylene-vinyl acetate copolymer, an ethylene-methyl methacrylate copolymer, polyolefin-based resins, such as polyethylene, polypropylene, and an ethylene-propylene copolymer, polyvinyl alcohol, polyvinylidene chloride, polyvinyl chloride, a vinyl chloride-vinyl acetate copolymer, polyvinyl acetate, polyamide, polyimide, celluloses, a fluorine-based resin, polyether, polystyrene-based resins such as polystyrene, polycarbonate, and polyether sulfone. Of those, polyester-based resins, such as polyethylene terephthalate (PET), polyethylene naphthalate (PEN), polybutylene terephthalate (PBT), and polybutylene naphthalate (PBN), and polyolefin-based resins, such as polyethylene, polypropylene, and an ethylene-propylene copolymer, are preferably used. When any of those resins is used, the pressure-sensitive adhesive sheet for semiconductor processing having excellent solvent resistance can be obtained. The base material may be a single layer, or may be a laminate of two or more layers.

The base material may further include another component to the extent that the effects of the present disclosure are not inhibited. Examples of the other component include an antioxidant, an ultra-violet (UV) absorber, a light stabilizer, and a heat stabilizer. With regard to the kind and usage amount of the other component, the other component may be used in any appropriate amount in accordance with purposes.

The thickness of the base material is preferably from 10 μm to 200 μm, more preferably from 20 μm to 150 μm.

C. Pressure-Sensitive Adhesive Layer

The pressure-sensitive adhesive layer 20 is formed of a pressure-sensitive adhesive composition containing a base polymer. The pressure-sensitive adhesive composition has a swelling degree $S_A$ of 2.1 times or less when immersed in an N,N-dimethylpropionamide solution at 23° C. for 1 hour. When the swelling degree $S_A$ of the pressure-sensitive adhesive composition is 2.1 times or less, the pressure-sensitive adhesive sheet for semiconductor processing having excellent solvent resistance is obtained. Even when the pressure-sensitive adhesive layer formed by using the pressure-sensitive adhesive composition having a swelling degree $S_A$ of 2.1 times or less is washed with a solvent in a state of being bonded to an adherend (e.g., a wafer), the solvent does not enter the space between the adherend and the pressure-sensitive adhesive layer, and hence a satisfactory adhesive property can be maintained. Accordingly, the pressure-sensitive adhesive sheet for semiconductor processing according to at least one embodiment of the present disclosure can also be suitably used in a semiconductor processing process including a solvent washing step.

C-1. Base Polymer

The base polymer is obtained by polymerizing a monomer composition containing any appropriate monomer component. Examples of the base polymer include resins, such as a (meth)acrylic resin, a vinyl alkyl ether-based resin, a silicone-based resin, a polyester-based resin, a polyamide-based resin, a urethane-based resin, or a styrene-diene block copolymer. Of those, a (meth)acrylic resin is preferably used. When the (meth)acrylic resin is used, a pressure-sensitive adhesive sheet in which the storage elastic modulus and tensile elastic modulus of the pressure-sensitive adhesive layer are easily adjusted, and which is excellent in balance between pressure-sensitive adhesive strength and peelability can be obtained. Further, contamination of an adherend by a component derived from the pressure-sensitive adhesive can be reduced. The "(meth)acrylic" refers to acrylic and/or methacrylic.

In the (meth)acrylic resin serving as the base polymer, the content ratio of an ester of (meth)acrylic acid having an alkyl group having 8 or more carbon atoms in all monomer components for forming the base polymer is preferably 50 wt % or more, more preferably from 50 wt % to 75 wt %, still more preferably from 60 wt % to 70 wt %. When the content ratio of the ester of (meth)acrylic acid having an alkyl group having 8 or more carbon atoms in all the monomer components for forming the base polymer falls within the above-mentioned ranges, the pressure-sensitive adhesive sheet for semiconductor processing having excellent solvent resistance can be provided.

The alkyl group having 8 or more carbon atoms may be a linear or branched alkyl group, and may be a cyclic alkyl group. The ester of (meth)acrylic acid preferably has a linear or branched alkyl group. The alkyl group is preferably an alkyl group having 8 or more carbon atoms, more preferably an alkyl group having 8 to 30 carbon atoms, still more preferably an alkyl group having 8 to 20 carbon atoms. Specific examples of the alkyl group include a 2-ethylhexyl group, an octyl group, an isooctyl group, a nonyl group, an isononyl group, a decyl group, an isodecyl group, an undecyl group, a lauryl group, a tridecyl group, a tetradecyl group, a pentadecyl group, a hexadecyl group, a heptadecyl group, a stearyl group, an isostearyl group, an octadecyl group, a nonadecyl group, an eicosyl group, and a dodecyl group.

Specific examples of the ester of (meth)acrylic acid having an alkyl group having 8 or more carbon atoms include 2-ethylhexyl(meth)acrylate, octyl(meth)acrylate, isooctyl(meth)acrylate, nonyl(meth)acrylate, isononyl (meth)acrylate, decyl(meth)acrylate, isodecyl(meth)acrylate, undecyl(meth)acrylate, dodecyl(meth)acrylate, tridecyl (meth)acrylate, tetradecyl(meth)acrylate, pentadecyl(meth) acrylate, hexadecyl(meth)acrylate, heptadecyl(meth) acrylate, octadecyl(meth)acrylate, nonadecyl(meth)acrylate, eicosyl(meth)acrylate, lauryl(meth)acrylate, stearyl(meth) acrylate, and isostearyl (meth)acrylate. Those esters may be used alone or in combination thereof.

The monomer composition may contain another monomer copolymerizable with the ester of (meth)acrylic acid having an alkyl group having 8 or more carbon atoms as required for the purpose of modifying, for example, cohesive strength, heat resistance, or cross-linkability. Examples of such monomer include carboxyl group-containing monomers, such as acrylic acid and methacrylic acid; acid anhydride monomers, such as maleic anhydride and itaconic anhydride; hydroxyl group-containing monomers, such as hydroxyethyl (meth)acrylate and hydroxypropyl (meth) acrylate; sulfonic acid group-containing monomers, such as styrenesulfonic acid and allylsulfonic acid; nitrogen-containing monomers, such as (meth)acrylamide, N,N-dimethyl (meth)acrylamide, and acryloylmorpholine; aminoalkyl (meth)acrylate-based monomers such as aminoethyl (meth) acrylate; alkoxyalkyl (meth)acrylate-based monomers such as methoxyethyl (meth)acrylate; maleimide-based monomers, such as N-cyclohexylmaleimide and N-isopropylmaleimide; itaconimide-based monomers, such as N-methylitaconimide and N-ethylitaconimide; succinimide-based monomers; vinyl-based monomers, such as vinyl acetate, vinyl propionate, N-vinylpyrrolidone, and methylvinylpyrrolidone; cyanoacrylate monomers, such as acrylonitrile and methacrylonitrile; epoxy group-containing acrylic monomers such as glycidyl (meth)acrylate; glycol-based acrylic ester monomers, such as polyethylene glycol (meth)acrylate and polypropylene glycol (meth)acrylate; acrylic acid ester-based monomers each having a heterocycle, a halogen atom, a silicon atom, or the like, such as tetrahydrofurfuryl(meth) acrylate, fluorine (meth)acrylate, and silicone (meth)acrylate; olefin-based monomers, such as isoprene, butadiene, and isobutylene; and vinyl ether-based monomers such as vinyl ether. Those monomer components may be used alone or in combination thereof. The other monomer is used at such a content ratio that the total of the other monomer and the ester of (meth)acrylic acid having an alkyl group having 8 or more carbon atoms is 100 wt %.

The content ratio of a polar group-containing monomer in all the monomer components for forming the base polymer is preferably 10 wt % or less, more preferably 7 wt % or less, still more preferably 5 wt % or less, and particularly preferably 3 wt % or less. In at least one embodiment of the present disclosure, the polar group-containing monomer is not incorporated as the monomer component for forming the base polymer (its content ratio may be 0 wt %). Examples of the polar group-containing monomer include carboxyl group-containing monomers, such as acrylic acid and methacrylic acid.

The weight-average molecular weight of the (meth) acrylic resin serving as the base polymer is preferably 300,000 or more, more preferably 500,000 or more, still more preferably from 800,000 to 3,000,000. When the weight-average molecular weight falls within such ranges, bleeding of a low-molecular-weight component can be prevented, and hence the pressure-sensitive adhesive sheet having a low contamination property can be obtained. The molecular weight distribution (weight-average molecular weight/number-average molecular weight) of the (meth) acrylic resin serving as the base polymer is preferably from 1 to 20, more preferably from 3 to 10. When a polymer having a narrow molecular weight distribution is used, bleeding of the low-molecular-weight component can be prevented, and hence the pressure-sensitive adhesive sheet having a low contamination property can be obtained. The weight-average molecular weight and the number-average molecular weight may be determined by gel permeation chromatography measurement (solvent: tetrahydrofuran, polystyrene equivalent).

The base polymer is preferably a base polymer having a carbon-carbon double bond. The base polymer having a carbon-carbon double bond may have a carbon-carbon double bond in a main chain thereof, may have a carbon-carbon double bond in a side chain thereof, or may have a carbon-carbon double bond at a terminal thereof.

The polymer having a carbon-carbon double bond may be obtained by any appropriate method. The polymer may be obtained by, for example, subjecting a resin obtained by any appropriate polymerization method and a compound having a carbon-carbon double bond to a reaction (e.g., a condensation reaction or an addition reaction). Specifically, when the (meth)acrylic resin is used, the resin may be obtained by subjecting a (meth)acrylic resin (copolymer) having a structural unit derived from a monomer having any appropriate functional group to polymerization in any appropriate solvent, and then subjecting the resultant to a reaction between a functional group of the acrylic resin and the compound having a carbon-carbon double bond that may react with the functional group. The amount of the compound having a carbon-carbon double bond to be subjected to the reaction is preferably from 4 parts by weight to 30 parts by weight, more preferably from 4 parts by weight to 20 parts by weight with respect to 100 parts by weight of the above-mentioned resin. Any appropriate solvent may be used as the solvent. Examples thereof include various organic solvents, such as ethyl acetate, methyl ethyl ketone, and toluene.

When the resin and the compound having a carbon-carbon double bond are subjected to a reaction with each other as described above, the resin and the compound having a carbon-carbon double bond preferably have functional groups that can react with each other. The combination of the functional groups is, for example, a carboxyl group/an epoxy group, a carboxyl group/an aziridine group, or a hydroxyl group/an isocyanate group. Of those combinations of the functional groups, a combination of a hydroxyl group and an isocyanate group is preferred from the viewpoint of ease of reaction tracking. As described above, in at least one embodiment of the present disclosure, the content ratio of the polar group-containing monomer in all the monomer components for forming the base polymer is preferably 10 wt % or less. When the base polymer has a carbon-carbon double bond, the polar group-containing monomer is preferably used so that the molar ratio thereof be an equal amount to that of the compound having a carbon-carbon double bond.

Examples of the compound having a carbon-carbon double bond include 2-isocyanatoethyl methacrylate, methacryloyl isocyanate, 2-methacryloyloxyethyl isocyanate (2-isocyanatoethyl methacrylate), and m-isopropenyl-α,α-dimethylbenzyl isocyanate.

C-2. Phosphoric Acid Ester-Based Surfactant

The pressure-sensitive adhesive composition preferably further contains a phosphoric acid ester-based surfactant.

When the pressure-sensitive adhesive composition further contains the phosphoric acid ester-based surfactant, a pressure-sensitive adhesive sheet for semiconductor processing further improved in solvent resistance is obtained. Examples of the phosphoric acid ester-based surfactant include a phosphoric acid monoester of a polyoxyethylene alkyl ether or a polyoxyethylene alkylaryl ether, a phosphoric acid diester of a polyoxyethylene alkyl ether or a polyoxyethylene alkylaryl ether, a phosphoric acid triester of a polyoxyethylene alkyl ether or a polyoxyethylene alkylaryl ether, an alkyl phosphoric acid ester, an alkyl ether phosphoric acid ester, and salts thereof. Examples of the salts include a sodium salt and a potassium salt. Of those, a polyoxyethylene alkyl ether phosphate and salts thereof may be preferably used. Those phosphoric acid ester-based surfactants may be used alone or in combination thereof.

A polyoxyethylene alkyl ether phosphate is a phosphoric acid ester of a product obtained by addition polymerization of ethylene oxide to a higher alcohol. The number of carbon atoms of the higher alcohol is preferably from 8 to 22, more preferably from 10 to 20, still more preferably from 12 to 18. The number of moles of ethylene oxide added is preferably from 1 to 15, more preferably from 2 to 12, still more preferably from 2 to 10. When such polyoxyethylene alkyl ether phosphate is adopted, the pressure-sensitive adhesive sheet for semiconductor processing having excellent solvent resistance can be provided.

The content of the phosphoric acid ester-based surfactant is preferably 0.03 part by weight or more, more preferably from 0.1 part by weight to 1 part by weight, and still more preferably from 0.2 part by weight to 0.5 part by weight with respect to 100 parts by weight of the base polymer. When the content of the phosphoric acid ester-based surfactant falls within the above-mentioned ranges, the pressure-sensitive adhesive sheet for semiconductor processing having excellent solvent resistance can be provided.

C-3. Photopolymerization Initiator

In at least one embodiment of the present disclosure, the pressure-sensitive adhesive composition is a UV-curable pressure-sensitive adhesive. The pressure-sensitive adhesive composition which is UV-curable further contains a photopolymerization initiator. Any appropriate initiator may be used as the photopolymerization initiator. Examples of the photopolymerization initiator include acyl phosphine oxide-based photopolymerization initiators, such as ethyl 2,4,6-trimethylbenzylphenyl phosphinate and (2,4,6-trimethylbenzoyl)-phenylphosphine oxide; α-ketol-based compounds, such as 4-(2-hydroxyethoxy)phenyl(2-hydroxy-2-propyl) ketone, α-hydroxy-α,α'-dimethylacetophenone, 2-methyl-2-hydroxypropiophenone, and 1-hydroxycyclohexyl phenyl ketone; acetophenone-based compounds, such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds, such as benzoin ethyl ether, benzoin isopropyl ether, and anisoin methyl ether; ketal-based compounds such as benzyl dimethyl ketal; aromatic sulfonyl chloride-based compounds such as 2-naphthalenesulfonyl chloride; photoactive oxime-based compounds such as 1-phenone-1,1-propanedione-2-(o-ethoxycarbonyl)oxime; benzophenone-based compounds, such as benzophenone, benzoylbenzoic acid, and 3,3'-dimethyl-4-methoxybenzophenone; thioxanthone-based compounds, such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; and acyl phosphonates, and α-hydroxyacetophenones such as 2-hydroxy-1-(4-(4-(2-hydroxy-2-methylpropionyl)benzyl)phenyl-2-methylpropane-1. Of those, acetophenone-based compounds may be preferably used. The photopolymerization initiators may be used alone or in combination thereof.

A commercially available product may be used as the photopolymerization initiator. Examples thereof include products available under the product names Omnirad 127, Omnirad 369, and Omnirad 651 from IGM Resins B.V.

The photopolymerization initiator may be used in any appropriate amount. The content of the photopolymerization initiator is preferably from 0.5 part by weight to 20 parts by weight, more preferably from 0.5 part by weight to 10 parts by weight with respect to 100 parts by weight of the above-mentioned UV-curable pressure-sensitive adhesive. When the content of the photopolymerization initiator is less than 0.5 part by weight, the UV-curable pressure-sensitive adhesive may not be sufficiently cured at the time of UV irradiation. When the content of the photopolymerization initiator is more than 10 parts by weight, the storage stability of the pressure-sensitive adhesive may reduce.

C-4. Additive

The pressure-sensitive adhesive composition may contain any appropriate additive as required. Examples of the additive include a cross-linking agent, a catalyst (e.g., a platinum catalyst), a tackifier, a plasticizer, a pigment, a dye, a filler, an age resistor, a conductive material, a UV absorber, a light stabilizer, a release modifier (light release agent), a softener, a surfactant except the phosphoric acid ester-based surfactant, a flame retardant, a solvent, and an oligomer.

In at least one embodiment of the present disclosure, the UV-curable pressure-sensitive adhesive further contains a cross-linking agent. Examples of the cross-linking agent include an isocyanate-based cross-linking agent, an epoxy-based cross-linking agent, an aziridine-based cross-linking agent, and a chelate-based cross-linking agent. The content ratio of the cross-linking agent is preferably from 0.01 part by weight to 10 parts by weight, more preferably from 0.02 part by weight to 5 part by weight, still more preferably from 0.025 part by weight to 0.5 part by weight with respect to 100 parts by weight of the base polymer in the UV-curable pressure-sensitive adhesive. The flexibility of the pressure-sensitive adhesive layer can be controlled by the content ratio of the cross-linking agent. When the content of the cross-linking agent is less than 0.01 part by weight, the pressure-sensitive adhesive becomes sol, and hence the pressure-sensitive adhesive layer may not be formed. When the content of the cross-linking agent is more than 10 parts by weight, adhesiveness to an adherend may reduce.

In at least one embodiment of the present disclosure, the isocyanate-based cross-linking agent is preferably used. The isocyanate-based cross-linking agent is preferred because the cross-linking agent can react with various kinds of functional groups. A cross-linking agent having 3 or more isocyanate groups is particularly preferably used. When the isocyanate-based cross-linking agent is used as the cross-linking agent and the content ratio of the cross-linking agent falls within the above-mentioned ranges, the UV-curable pressure-sensitive adhesive having excellent followability to unevenness of the surface of the adherend, and an excellent anchoring property with the base material can be provided.

The thickness of the pressure-sensitive adhesive layer may be set to any appropriate value. The thickness of the pressure-sensitive adhesive layer is preferably from 10 μm to 500 μm, more preferably from 15 μm to 300 μm, still more preferably from 20 μm to 250 μm. When the thickness of the pressure-sensitive adhesive layer falls within the above-mentioned ranges, sufficient pressure-sensitive adhesive strength to an adherend can be exhibited.

The gel fraction of the UV-curable pressure-sensitive adhesive is preferably from 20% to 90%, more preferably from 30% to 85%, still more preferably from 40% to 80%. The gel fraction may be determined as an insoluble content with respect to a solvent such as ethyl acetate. Specifically, the gel fraction is determined as a weight fraction (unit: wt %) of an insoluble component after the UV-curable pressure-sensitive adhesive is immersed in ethyl acetate at 23° C. for 7 days with respect to a sample before immersion. In general, the gel fraction of a polymer is equivalent to the cross-linking degree thereof, and a larger number of cross-linked moieties in the polymer means a larger gel fraction. The gel fraction (introduction amount of a cross-linked structure) may be adjusted to a desired range by a method of introducing the cross-linked structure, the kind and amount of the cross-linking agent, or the like.

D. Production Method for Pressure-Sensitive Adhesive Sheet for Semiconductor Processing The pressure-sensitive adhesive sheet for semiconductor processing may be produced by any appropriate method. The pressure-sensitive adhesive sheet for semiconductor processing may be obtained by, for example, a method involving applying a pressure-sensitive adhesive solution (UV-curable pressure-sensitive adhesive) to a release liner, followed by drying to form a pressure-sensitive adhesive layer on the release liner, and then bonding the resultant to the base material. In addition, the pressure-sensitive adhesive sheet for semiconductor processing may be obtained by applying the UV-curable pressure-sensitive adhesive to the base material, followed by drying. Various methods, such as bar coating, air knife coating, gravure coating, gravure reverse coating, reverse roll coating, lip coating, die coating, dip coating, offset printing, flexographic printing, and screen printing, may each be adopted as a method of applying the pressure-sensitive adhesive composition. Any appropriate method may be adopted as a method for the drying.

E. Usage of Pressure-Sensitive Adhesive Sheet for Semiconductor Processing

The pressure-sensitive adhesive sheet for semiconductor processing can be suitably used in a semiconductor production process. As described above, even when the pressure-sensitive adhesive sheet for semiconductor processing according to at least one embodiment of the present disclosure is brought into contact with a solvent, a reduction in anchoring force between the base material and pressure-sensitive adhesive layer of the sheet can be suppressed. Accordingly, the pressure-sensitive adhesive sheet for semiconductor processing can also be suitably used in a semiconductor production process including a solvent washing step. Examples of the solvent to be used in the solvent washing step include solvents each typically used in a production method for a semiconductor, such as 2,2-bis (hydroxymethyl)propionic acid (DBPA), propylene glycol monomethyl ether (PGME), propylene glycol monomethyl ether acetate (MGMEA), isopropanol (IPA), methyl ethyl ketone (MEK), N-methyl-2-pyrrolidone (NMP), and tetramethylammonium hydroxide (TMAH).

EXAMPLES

The present disclosure is specifically described below by way of examples, but the present disclosure is not limited to these examples. In addition, "part(s)" and "%" in the examples are by weight unless otherwise stated.

Example 1

Lauryl methacrylate (LMA)/2-hydroxyethyl methacrylate (HEMA)/2-isocyanatoethyl methacrylate (MOI)=100/22/18 (molar ratio) (content ratio of the ester of acrylic acid or methacrylic acid having an alkyl group having 8 or more carbon atoms: 82 wt %) were polymerized to provide an acrylic polymer. Specifically, LMA, HEMA, 0.1 parts by weight of a polymerization initiator (2,2'-azodiisobutyronitrile (AIBN)), and solvent (ethyl acetate) were loaded into an experimental apparatus for polymerization obtained by mounting a 1-liter round-bottom separable flask with a separable cover, a separating funnel, a temperature gauge, a nitrogen-introducing tube, a Liebig condenser, a vacuum seal, a stirring rod, and a stirring blade (solid content: 36 wt %). While they were stirred, the apparatus was purged with nitrogen. After that, while they were stirred in a stream of nitrogen, they were subjected to polymerization at 65° C. Thus, a resin solution was obtained. After that, the apparatus was purged with air and then MOI was added to the resultant resin solution. After that, they were subjected to addition reaction at 40° C. Thus, a solution containing the acrylic polymer was obtained.

100 parts by weight of the obtained acrylic polymer, 5 parts by weight of a tackifier (manufactured by Arakawa Chemical Industries, Ltd., product name: TAMANOL 526), 3 parts by weight of a light release agent (manufactured by NOF Corporation, product name: UNIOL D-1200), 0.2 part by weight of a phosphoric acid ester-based surfactant (manufactured by Toho Chemical Industry Co., Ltd., product name: PHOSPHANOL RL-210), 3 parts by weight of a polymerization initiator (manufactured by IGM Resins B.V., product name: Omnirad 379EG), 0.05 part by weight of a cross-linking agent (manufactured by Mitsubishi Gas Chemical Company, Inc., product name: TETRAD-C), and 2.5 parts by weight of a cross-linking agent (manufactured by Nippon Polyurethane Industry Co., Ltd., product name: "Coronate L") were mixed with ethyl acetate. Thus, a pressure-sensitive adhesive composition was obtained.

One surface of a polyester film having a thickness of 38 μm (manufactured by Mitsubishi Polyester Film Corporation, product name: MRF) was subjected to release treatment with silicone. The obtained pressure-sensitive adhesive composition was applied to the release-treated surface, and was heated at 120° C. for 2 minutes. Thus, a pressure-sensitive adhesive layer having a thickness of 20 μm was formed. Next, the pressure-sensitive adhesive layer was transferred onto a polyethylene-based film (manufactured by Nitto Denko Corporation, thickness: 80 μm) serving as a base material, and then the resultant was stored at 50° C. for 48 hours. Thus, a pressure-sensitive adhesive sheet was obtained.

Example 2

A pressure-sensitive adhesive composition was obtained in the same manner as in Example 1 except that the tackifier was not added.

A pressure-sensitive adhesive sheet was produced in the same manner as in Example 1 except that a pressure-sensitive adhesive layer was formed using the obtained pressure-sensitive adhesive composition.

Example 3

2-ethylhexyl acrylate (2EHA)/2-hydroxyethyl acrylate (HEA)/2-isocyanatoethyl methacrylate (MOI)=100/20/16

(molar ratio) (content ratio of the ester of acrylic acid or methacrylic acid having an alkyl group having 8 or more carbon atoms: 78 wt %) were polymerized to provide an acrylic polymer. Specifically, 2EHA, HEA, 0.1 parts by weight of a polymerization initiator (2,2'-azodiisobutyronitrile (AIBN)), and solvent (ethyl acetate) were loaded into an experimental apparatus for polymerization obtained by mounting a 1-liter round-bottom separable flask with a separable cover, a separating funnel, a temperature gauge, a nitrogen-introducing tube, a Liebig condenser, a vacuum seal, a stirring rod, and a stirring blade (solid content: 36 wt %). While they were stirred, the apparatus was purged with nitrogen. After that, while they were stirred in a stream of nitrogen, they were subjected to polymerization at 65° C. Thus, a resin solution was obtained. After that, the apparatus was purged with air and then MOI was added to the resultant resin solution. After that, they were subjected to addition reaction at 40° C. Thus, a solution containing the acrylic polymer was obtained.

100 parts by weight of the obtained acrylic polymer, 2 parts by weight of a polymerization initiator (manufactured by IGM Resins B.V., product name: Omnirad 651), and 0.75 part by weight of a cross-linking agent (manufactured by Nippon Polyurethane Industry Co., Ltd., product name: "Coronate L") were mixed with ethyl acetate. Thus, a pressure-sensitive adhesive composition was obtained.

A pressure-sensitive adhesive sheet was produced in the same manner as in Example 1 except that a pressure-sensitive adhesive layer was formed using the obtained pressure-sensitive adhesive composition.

Example 4

2-ethylhexyl acrylate (2EHA)/acryloyl morpholine (ACMO)/2-hydroxyethyl acrylate (HEA)/2-isocyanatoethyl methacrylate (MOI)=75/25/20/11 (molar ratio) (content ratio of the ester of acrylic acid or methacrylic acid having an alkyl group having 8 or more carbon atoms: 64 wt %) were polymerized to provide an acrylic polymer. Specifically, 2EHA, ACMO, HEA, 0.1 parts by weight of a polymerization initiator (2,2'-azodiisobutyronitrile (AIBN)), and solvent (ethyl acetate) were loaded into an experimental apparatus for polymerization obtained by mounting a 1-liter round-bottom separable flask with a separable cover, a separating funnel, a temperature gauge, a nitrogen-introducing tube, a Liebig condenser, a vacuum seal, a stirring rod, and a stirring blade (solid content: 36 wt %). While they were stirred, the apparatus was purged with nitrogen. After that, while they were stirred in a stream of nitrogen, they were subjected to polymerization at 65° C. Thus, a resin solution was obtained. After that, the apparatus was purged with air and then MOI was added to the resultant resin solution. After that, they were subjected to addition reaction at 40° C. Thus, a solution containing the acrylic polymer was obtained.

100 parts by weight of the obtained acrylic polymer, 0.3 part by weight of a phosphoric acid ester-based surfactant (manufactured by Toho Chemical Industry Co., Ltd., product name: PHOSPHANOL RL-210), 3 parts by weight of a polymerization initiator (manufactured by IGM Resins B.V., product name: Omnirad 127), and part by weight of a cross-linking agent (manufactured by Nippon Polyurethane Industry Co., Ltd., product name: "Coronate L") were mixed with ethyl acetate. Thus, a pressure-sensitive adhesive composition was obtained.

A pressure-sensitive adhesive sheet was produced in the same manner as in Example 1 except that a pressure-sensitive adhesive layer was formed using the obtained pressure-sensitive adhesive composition.

Comparative Example 1

Butyl acrylate (BA)/ethyl acrylate (EA)/2-hydroxyethyl acrylate (HEA)/2-isocyanatoethyl methacrylate (MOI)=50/ 50/22/18 (molar ratio) (content ratio of the ester of acrylic acid or methacrylic acid having an alkyl group having 8 or more carbon atoms: 0 wt %) were polymerized to provide an acrylic polymer. 100 parts by weight of the obtained acrylic polymer, 3 parts by weight of a polymerization initiator (manufactured by IGM Resins B.V., product name: Omnirad 651), and 0.2 part by weight of a cross-linking agent (manufactured by Nippon Polyurethane Industry Co., Ltd., product name: "Coronate L") were mixed with ethyl acetate. Thus, a pressure-sensitive adhesive composition was obtained. Specifically, BA, EA, HEA, 0.1 parts by weight of a polymerization initiator (2,2'-azodiisobutyronitrile (AIBN)), and solvent (ethyl acetate) were loaded into an experimental apparatus for polymerization obtained by mounting a 1-liter round-bottom separable flask with a separable cover, a separating funnel, a temperature gauge, a nitrogen-introducing tube, a Liebig condenser, a vacuum seal, a stirring rod, and a stirring blade (solid content: 36 wt %). While they were stirred, the apparatus was purged with nitrogen. After that, while they were stirred in a stream of nitrogen, they were subjected to polymerization at 65° C. Thus, a resin solution was obtained. After that, the apparatus was purged with air and then MOI was added to the resultant resin solution. After that, they were subjected to addition reaction at 40° C. Thus, a solution containing the acrylic polymer was obtained.

A pressure-sensitive adhesive sheet was produced in the same manner as in Example 1 except that the obtained pressure-sensitive adhesive composition was used.

Comparative Example 2

A monomer composition (content ratio of the ester of acrylic acid or methacrylic acid having an alkyl group having 8 or more carbon atoms: 0 wt %) formed of butyl acrylate (BA)/acrylonitrile (AN)/acrylic acid (AA)=80/15/ 2.5 (molar ratio) was polymerized to provide an acrylic polymer. 100 parts by weight of the obtained acrylic polymer, 60 parts by weight of a light release agent (manufactured by ADEKA Corporation, product name: ADK CIZER D-810), 7 parts by weight of a cross-linking agent (manufactured by DIC Corporation, product name: SUPER BECKAMINE SJ820-60N), and 2 parts by weight of a cross-linking agent (manufactured by Nippon Polyurethane Industry Co., Ltd., product name: "Coronate L") were mixed with ethyl acetate. Thus, a pressure-sensitive adhesive composition was obtained.

A pressure-sensitive adhesive sheet was produced in the same manner as in Example 1 except that the obtained pressure-sensitive adhesive composition was used.

Comparative Example 3

A monomer composition (content ratio of the ester of acrylic acid or methacrylic acid having an alkyl group having 8 or more carbon atoms: 0 wt %) formed of butyl acrylate (BA)/acrylonitrile (AN)/acrylic acid (AA)=80/15/ 2.5 (molar ratio) was polymerized to provide an acrylic polymer. 100 parts by weight of the obtained acrylic polymer, 20 parts by weight of a light release agent (manufactured by ADEKA Corporation, product name: ADK CIZER D-810), and 10 parts by weight of a cross-linking agent (manufactured by DIC Corporation, product name: SUPER BECKAMINE SJ820-60N) were mixed with ethyl acetate. Thus, a pressure-sensitive adhesive composition was obtained.

A pressure-sensitive adhesive sheet was produced in the same manner as in Example 1 except that the obtained pressure-sensitive adhesive composition was used.

<Evaluation>

The following evaluations were performed using the pressure-sensitive adhesive sheets obtained in Examples and Comparative Examples. The results are shown in Table 1.

1. Swelling Degree $S_A$ 0.1 part by weight of the pressure-sensitive adhesive composition used for forming the pressure-sensitive adhein 300 ml of the N,N-dimethylpropionamide solution for 24 hours so that the sample was not bent. After the immersion, the evaluation sample was taken out, and was then immersed in 300 ml of the isopropyl alcohol (manufactured by Tokyo Chemical Industry Co., Ltd.) solution for 10 minutes. After that, the evaluation sample was taken out, and was dried at 23° C. for 24 hours. Next, the state of the evaluation sample was visually observed, and a case in which the pressure-sensitive adhesive layer was peeled from the base material, or the pressure-sensitive adhesive layer was eluted into the solvent was indicated by an "x" symbol (Not good), and a case in which a state in which the pressure-sensitive adhesive layer was formed on the base material was maintained (a case in which the pressure-sensitive adhesive layer was not peeled from the base material) was indicated by a circle symbol (Good).

TABLE 1

| | | Example 1 | Example 2 | Example 3 | Example 4 | Comparative Example 1 | Comparative Example 2 | Comparative Example 3 |
|---|---|---|---|---|---|---|---|---|
| Pressure-sensitive adhesive composition | Composition of base polymer | LMA/HEMA/MOI | LMA/HEMA/MOI | 2EHA/HEA/MOI | 2EHA/ACMO/HEA/MOI | BA/EA/HEA/MOI | BA/AN/AA | BA/AN/AA |
| | Presence or absence of phosphoric acid ester-based surfactant | ○ (Presence) | ○ (Presence) | x (Absence) | ○ (Presence) | x (Absence) | x (Absence) | x (Absence) |
| Evaluation | Swelling degree | 1.7 | 2.0 | 1.8 | 1.7 | 2.3 | 2.7 | 2.7 |
| | Immersion test | ○ | ○ | ○ | ○ | x | x | x | sive layer of each of Examples or Comparative Examples was covered with a porous polytetrafluoroethylene film having an average pore diameter of 0.2 μm in a drawstring bag shape, and an opening was then tied with a kite string. Thus, an evaluation sample was obtained. As the porous polytetrafluoroethylene film, a product available under the product name "Nitoflon (trademark) NTF1122" (manufactured by Nitto Denko Corporation, average pore diameter: 0.2 μm, porosity: 75%, thickness: 85 μm) was used. The evaluation sample was immersed in 50 mL of an N,N-dimethylpropionamide (manufactured by Tokyo Chemical Industry Co., Ltd.) solution at 23° C. for 1 hour. Then, the evaluation sample was taken out from the N,N-dimethylpropionamide solution. Next, the N,N-dimethylpropionamide solution adhering to the outer surface of the evaluation sample was wiped off, and the weight of the evaluation sample was measured.

Swelling degree (times)=$(W4-W2-W3)/(W1)$ where W1 represents the weight of 0.1 part by weight of the pressure-sensitive adhesive composition, W2 represents the weight of the porous polytetrafluoroethylene film used for covering the pressure-sensitive adhesive composition, W3 represents the weight of the kite string, and W4 represents the weight of the evaluation sample after the immersion.

2. Immersion Test

The pressure-sensitive adhesive sheet obtained in each of Examples and Comparative Examples was cut into a size of 50 mm×50 mm. Thus, an evaluation sample was obtained. An N,N-dimethylpropionamide solution and an isopropyl alcohol solution were prepared. A release sheet (release-treated polyester film) of the pressure-sensitive adhesive sheet was peeled, and the evaluation sample was immersed The pressure-sensitive adhesive sheet for semiconductor processing of the present disclosure has excellent solvent resistance, and hence can be suitably used in a semiconductor production process including a solvent washing step.

According to at least one embodiment of the present disclosure, the pressure-sensitive adhesive sheet for semiconductor processing having excellent solvent resistance can be provided. Even when the pressure-sensitive adhesive sheet for semiconductor processing according to at least one embodiment of the present disclosure is washed with a solvent in a state of being bonded to an adherend (e.g., a wafer), the solvent does not enter the space between the adherend and the pressure-sensitive adhesive layer of the sheet, and hence a satisfactory adhesive property can be maintained. Further, even after the pressure-sensitive adhesive sheet for semiconductor processing has been subjected to a solvent washing step, peeling between the base material and pressure-sensitive adhesive layer of the sheet can be suppressed.

What is claimed is:

1. A pressure-sensitive adhesive sheet for semiconductor processing, comprising:

a pressure-sensitive adhesive layer formed of a pressure-sensitive adhesive composition containing a base polymer; and a base material, wherein the pressure-sensitive adhesive composition has a swelling degree $S_A$ of 2.1 times or less when immersed in an N,N-dimethylpropionamide solution at 23° C. for 1 hour, wherein the pressure-sensitive adhesive composition is a UV-curable pressure-sensitive adhesive, and wherein a content ratio of a cross-linking agent is in a range from 0.01 part by weight to 0.75 part by weight with respect to 100 parts by weight of the base polymer.

2. The pressure-sensitive adhesive sheet for semiconductor processing according to claim 1, wherein a content ratio of an ester of one of acrylic acid or methacrylic acid having an alkyl group having 8 or more carbon atoms in all monomer components for forming the base polymer is 50 wt % or more.

3. The pressure-sensitive adhesive sheet for semiconductor processing according to claim 1, wherein the base polymer is a polymer having a carbon-carbon double bond introduced thereinto.

4. The pressure-sensitive adhesive sheet for semiconductor processing according to claim 1, wherein the base material contains one of a polyester-based resin or a polyolefin-based resin.

5. The pressure-sensitive adhesive sheet for semiconductor processing according to claim 1, wherein the pressure-sensitive adhesive composition further contains a phosphoric acid ester-based surfactant.

6. The pressure-sensitive adhesive sheet for semiconductor processing according to claim 5, wherein a content of the phosphoric acid ester-based surfactant is 0.03 part by weight or more with respect to 100 parts by weight of the base polymer.

7. The pressure-sensitive adhesive sheet for semiconductor processing according to claim 1, wherein the pressure-sensitive adhesive sheet for semiconductor processing is used in a semiconductor processing process including a solvent washing step.

* * * * *